United States Patent
Jeong

(10) Patent No.: US 10,788,745 B2
(45) Date of Patent: Sep. 29, 2020

(54) PHOTOMASKS INCLUDING SHADING LAYER AND METHODS OF FORMING PATTERNS USING THE SAME

(71) Applicant: SK hynix Inc., Gyeonggi-do (KR)

(72) Inventor: Soo Kyeong Jeong, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 206 days.

(21) Appl. No.: 16/122,233

(22) Filed: Sep. 5, 2018

(65) Prior Publication Data
US 2019/0196323 A1    Jun. 27, 2019

(30) Foreign Application Priority Data

Dec. 21, 2017   (KR) .................. 10-2017-0176686

(51) Int. Cl.
*G03F 1/36*    (2012.01)
*G03F 1/38*    (2012.01)

(52) U.S. Cl.
CPC . *G03F 1/36* (2013.01); *G03F 1/38* (2013.01)

(58) Field of Classification Search
CPC ..................................... G03F 1/36; G03F 1/38
See application file for complete search history.

(56) References Cited

U.S. PATENT DOCUMENTS

| | | | |
|---|---|---|---|
| 7,629,093 B2* | 12/2009 | Jeong | G03F 1/34 205/317 |
| 8,137,870 B2* | 3/2012 | Lee | B82Y 10/00 430/30 |
| 8,435,705 B2* | 5/2013 | Han | B82Y 10/00 430/5 |
| 9,829,786 B2* | 11/2017 | Chen | G03F 1/26 |
| 2009/0208851 A1* | 8/2009 | Misaka | G03F 1/29 430/5 |

FOREIGN PATENT DOCUMENTS

KR   1020090047009   5/2009
KR      101435518   8/2014

* cited by examiner

*Primary Examiner* — Stewart A Fraser
(74) *Attorney, Agent, or Firm* — IP & T Group LLP

(57) ABSTRACT

A photomask and a method of forming patterns using the photomask are provided. The photomask includes a mask body including a pattern region and a peripheral region and having a first surface and a second surface. Mask patterns are disposed on a portion overlapping with the pattern region of the first surface of the mask body. A shading layer is disposed in the peripheral region. The shading layer provides a spill-over-shading region extending to overlap with a critical dimension (CD) correction region in which CD correction in the pattern region is required.

20 Claims, 10 Drawing Sheets

PHOTOMASKS INCLUDING SHADING LAYER AND METHODS OF FORMING PATTERNS USING THE SAME

CROSS-REFERENCE TO RELATED APPLICATIONS

The present application claims priority under 35 U.S.C 119(a) to Korean Application No. 10-2017-0176686, filed on Dec. 21, 2017, which is incorporated herein by references in its entirety.

BACKGROUND

1. Technical Field

The present application relates to a lithography technology and, more particularly, to photomasks including a shading layer and methods of forming patterns using the same.

2. Related Art

In the semiconductor industry, various techniques for forming fine patterns on a wafer have been used for increasing the integration density of semiconductor devices. Generally, as the size of the fine patterns is reduced, it becomes more difficult to control the critical dimensions (CDs) of the fine patterns. Accordingly, it may be necessary to develop techniques for improving the uniformity of the CDs of the fine patterns.

When fine patterns are formed on a wafer, a lithography technique may be used to transfer images of mask patterns of a photomask onto a photoresist layer coated on the wafer with an illumination light. In such a method, the CDs of the transferred patterns formed in the resist layer may be locally non-uniform according to the positions of the transferred patterns. Although, many methods of correcting the mask patterns of the photomask have been proposed to improve the uniformity of the CDs of the transferred patterns formed on the wafer, further improvements are needed.

SUMMARY

In accordance with an embodiment, there is provided a photomask. The photomask includes including a first surface and a second surface, the first surface including a first pattern region and a peripheral region, mask patterns disposed on the first pattern region, and a shading layer disposed in the peripheral region. The shading layer provides a spill-over-shading region extending to overlap with a critical dimension (CD) correction region of the first pattern region is required.

In accordance with another embodiment, there is provided a method of forming patterns using a photomask including a mask body including a pattern region and a peripheral region and having a first surface and a second surface, mask patterns disposed on a portion overlapping with the pattern region of the first surface of the mask body, and a shading layer disposed in the peripheral region, wherein the shading layer provides a spill-over-shading region extending to overlap with a critical dimension (CD) correction region in which CD correction in the pattern region is required. The method includes changing a position of the shading layer to control a width of an overlap region of the spill-over-shading region and the pattern region. Pattern images are transferred onto a resist layer using the photomask.

In accordance with another embodiment, the method includes providing a photomask, wherein the photomask comprises a mask body including a first surface and a second surface, the first surface including a first pattern region and a peripheral region, mask patterns disposed on the first pattern region, and a shading layer disposed in the peripheral region, and wherein the shading layer provides a spill-over-shading region extending to overlap with a critical dimension (CD) correction region of the first pattern region. The method further includes changing a position of the shading layer to control a width of an overlap region of the spill-over-shading region and the first pattern region, and transferring pattern images onto a resist layer using the photomask.

DETAILED DESCRIPTION OF THE EMBODIMENTS

Figure 1:
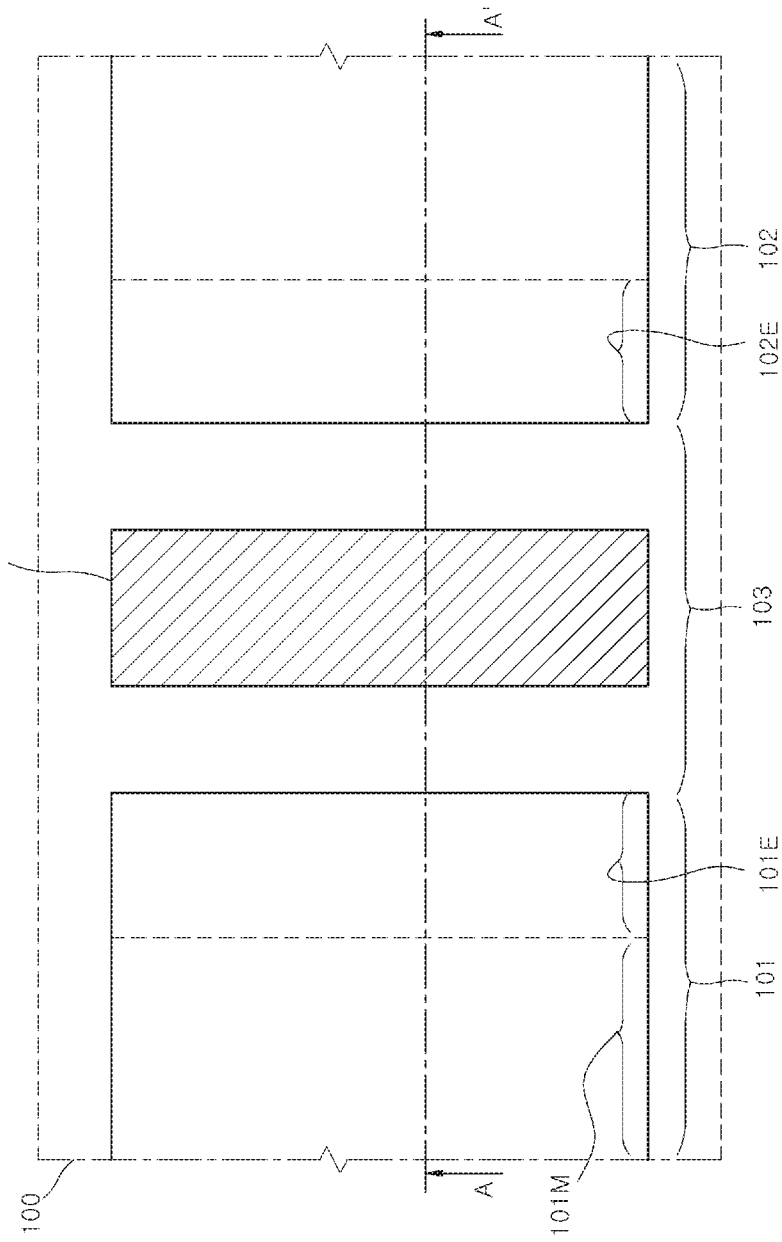
FIG. 1 is a plan view illustrating a photomask in accordance with an embodiment.

Hereinafter, various embodiments will be described in detail with reference to the accompanying drawings to the extent that a person skilled in the art to which the embodiments pertain may easily practice the embodiments. Among the reference numerals presented in the drawings, like reference numerals denote like members.

In describing the present disclosure, when it is determined that the detailed description of the known related art may obscure the gist of the present disclosure, the detailed description thereof will be omitted.

The terms used herein may correspond to words selected in consideration of their functions in the embodiments, and the meanings of the terms may be construed to be different according to the meaning that a skilled person having ordinary skill in the art would understand them in view of the described embodiments. If defined in detail, the terms may be construed according to the definitions. Unless otherwise defined, the terms used herein have the same meaning as commonly understood by one of ordinary skill in the art to which the embodiments belong.

It will be understood that although the terms first, second, third etc. may be used herein to describe various elements, these elements should not be limited by these terms. These terms are only used to distinguish one element from another element, but not used to define only the element itself or to mean a particular sequence. Thus, a first element in some embodiments could be termed a second element in other embodiments without departing from the teachings of the inventive concept.

It will also be understood that when an element or layer is referred to as being "on," "over," "below," "under," or "outside" another element or layer, the element or layer may be in direct contact with the other element or layer, or intervening elements or layers may be present. Other words used to describe the relationship between elements or layers should be interpreted in a like fashion (e.g., "between" versus "directly between" or "adjacent" versus "directly adjacent").

The following embodiments may be applied to realization of integrated circuits such as dynamic random access memory (DRAM) devices, phase change random access memory (PcRAM) devices or resistive random access memory (ReRAM) devices. Moreover, the following embodiments may be applied to realization of memory devices such as static random access memory (SRAM) devices, flash memory devices, magnetic random access memory (MRAM) devices or ferroelectric random access memory (FeRAM) devices. Furthermore, the following embodiments may be applied to realization of logic devices in which logic circuits are integrated. The following embodiments may also be applied to techniques for realizing various products including fine patterns.

Same reference numerals refer to same elements throughout the specification. Even though a reference numeral is not mentioned or described with reference to a drawing, the reference numeral may be mentioned or described with reference to another drawing. In addition, even though a reference numeral is not shown in a drawing, it may be mentioned or described with reference to another drawing.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

Figure 10:
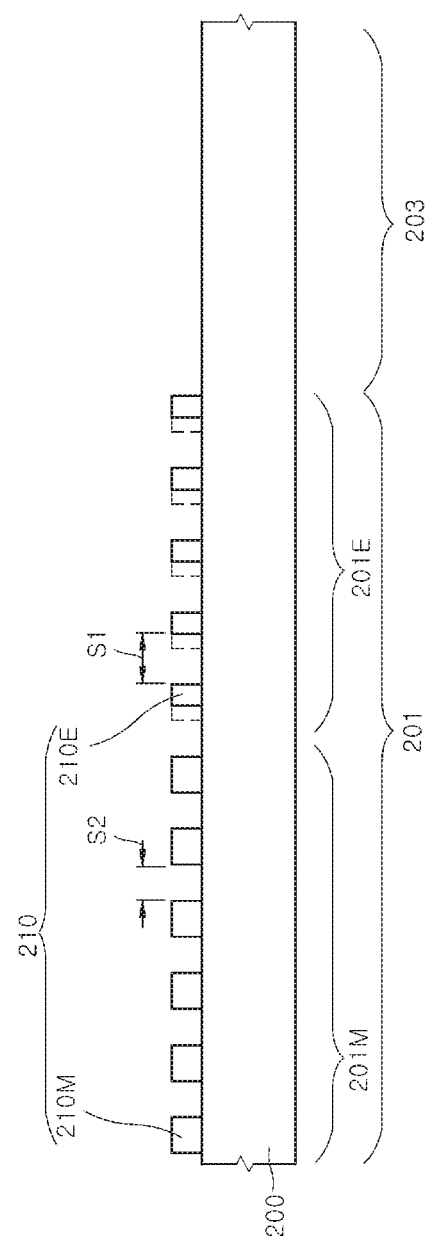
FIG. 10 is a cross-sectional view illustrating resist patterns transferred onto a wafer by a photomask according to a comparative example.

FIG. 1 is a plan view illustrating a photomask 100 in accordance with an embodiment. FIG. 10 is a cross-sectional view illustrating resist patterns 210 transferred onto a wafer by a photomask according to a comparative example.

Referring to FIG. 1, the photomask 100 may include pattern regions (e.g., first and second pattern regions 101 and 102) and a peripheral region 103. Each of the pattern regions 101 and 102 may include mask patterns 120 (see FIG. 3), images of which are transferred onto a resist layer coated on a wafer. The pattern regions 101 and 102 may correspond to cell array regions or field regions of a semiconductor device. The semiconductor device may be a device which is comprised of patterns that are formed by transferring images of the mask patterns of the photomask 100 onto the wafer. The peripheral region 103 may be adjacent to the pattern regions 101 and 102. The peripheral region 103 may be disposed between the pattern regions 101 and 102 and may be spaced apart from each pattern region 101 and 102 by a predetermined distance. The predetermined distance between the peripheral region 103 and the first region 101 may be the same as the distance between the peripheral region 103 and the second pattern region 102. The peripheral region 103 may be a region in which no mask pattern 120 is disposed. That is, the peripheral region 103 may be a mask pattern forbidden region without any mask patterns to be transferred onto the wafer. The peripheral region 103 may be located in the outside region of the field region or may be located between the cell array regions. For example, the peripheral region 103 may be disposed between the first pattern region 101 and the second pattern region 102. The peripheral region 103 may be adjacent to the first pattern region 101 and the second pattern region 102.

The first pattern region 101 may include a first edge region 101E which is adjacent to the peripheral region 103. A critical dimension (CD) variation of resist patterns formed by transferring the mask patterns in the first edge region 101E onto the wafer may be out of an allowable range. Similarly, the second pattern region 102 may include a second edge region 102E which is adjacent to the peripheral region 103, and a CD variation of resist patterns formed by transferring the mask patterns in the second edge region 102E onto the wafer may also be out of an allowable range. Accordingly, it may be necessary to correct the sizes of mask patterns in the first and second edge regions 101E and 102E. Heretofore, one method for correcting the sizes of the mask patterns in the first and second edge regions 101E and 102E includes using the process for fabricating the photomask. However, generally, it may be difficult to correct the sizes of the mask patterns in the first and second edge regions 101E and 102E using the fabrication process of the photomask. The present application provides a new method and device for correcting the CDs of transferred patterns (e.g., resist patterns) on a wafer without correcting the sizes of the mask patterns included in a photomask.

In accordance with various embodiments of the present disclosure, a shading layer region 104 may be disposed in the peripheral region 103 of the photomask 100. The shading layer region 104 can act as a correction element that induces correction of the CDs of transferred patterns which are formed in a region of a resist layer corresponding to the first and/or second edge regions 101E and/or 102E which are adjacent to the shading layer region 104.

FIG. 10 illustrates patterns formed on a wafer 200 by an exposure step and a development step using a conventional photomask (not shown) as a comparative example. According to the photomask of the comparative example, only a peripheral region is disposed between a pair of pattern regions. The resist patterns 210 may be formed on the wafer 200 by an exposure step and a development step using the photomask of the comparative example. The resist patterns 210 may be located in a pattern region 201 of the wafer 200 that corresponds to a pattern region of the photomask of the comparative example. No pattern is formed in a peripheral region 203 of the wafer 200 that corresponds to a peripheral region of the photomask of the comparative example.

First resist patterns 210E included in the resist patterns 210 may be formed in an edge region 201E of the wafer 200 corresponding to an edge region of the pattern region of the photomask of the comparative example, and the first resist patterns 210E may be formed to have a relatively large CD variation as compared with second resist patterns 210M (included in the resist patterns 210) which are formed in an inside region 201M located in an inner portion of the edge region 201E. For example, a first space S1 corresponding to a distance between the first resist patterns 210E may be greater than a second space S2 corresponding to a distance between the second resist patterns 210M. That is, line widths of the first resist patterns 210E or the first space S1 between the first resist patterns 210E may be undesirably controlled. Thus, the edge region of the photomask corresponding to the edge region 201E of the wafer 200 is a region that pattern correction is required.

Referring back to FIG. 1, the shading layer region 104 may be disposed to be spaced apart from the first edge region 101E of the photomask 100, which can be regarded as a region corresponding to the edge region (201E of FIG. 10) of the wafer (200 of FIG. 10). The shading layer region 104 may be introduced to provide a correction element that induces the transferred patterns (e.g., the first resist patterns 210E of FIG. 10), which are formed in a region of a resist layer corresponding to the first edge region 101E, to have normal uniform CDs. The shading layer region 104 may be set as a region that attenuates the intensity of an illumination light which is irradiated onto the photomask 100.

The first pattern region 101 may also include an inside region 101M which is adjacent to a side of the first edge region 101E opposite to the shading layer region 104. In such a case, the shading layer region 104 may be disposed to be spaced apart from the first edge region 101E or the first pattern region 101 so that the inside region 101M is not affected by the shading layer region 104 and the first edge region 101E is affected by the shading layer region 104. A location of the shading layer region 104 may be limited in the peripheral region 103 so that the shading layer region 104 does not overlap with the first edge region 101E. Since the shading layer region 104 does not overlap with the first edge region 101E, the attenuation of intensity of the illumination light penetrating the shading layer region 104 does not substantially affect the transfer of the images of the mask patterns disposed in the inside region 101M.

Figure 3:
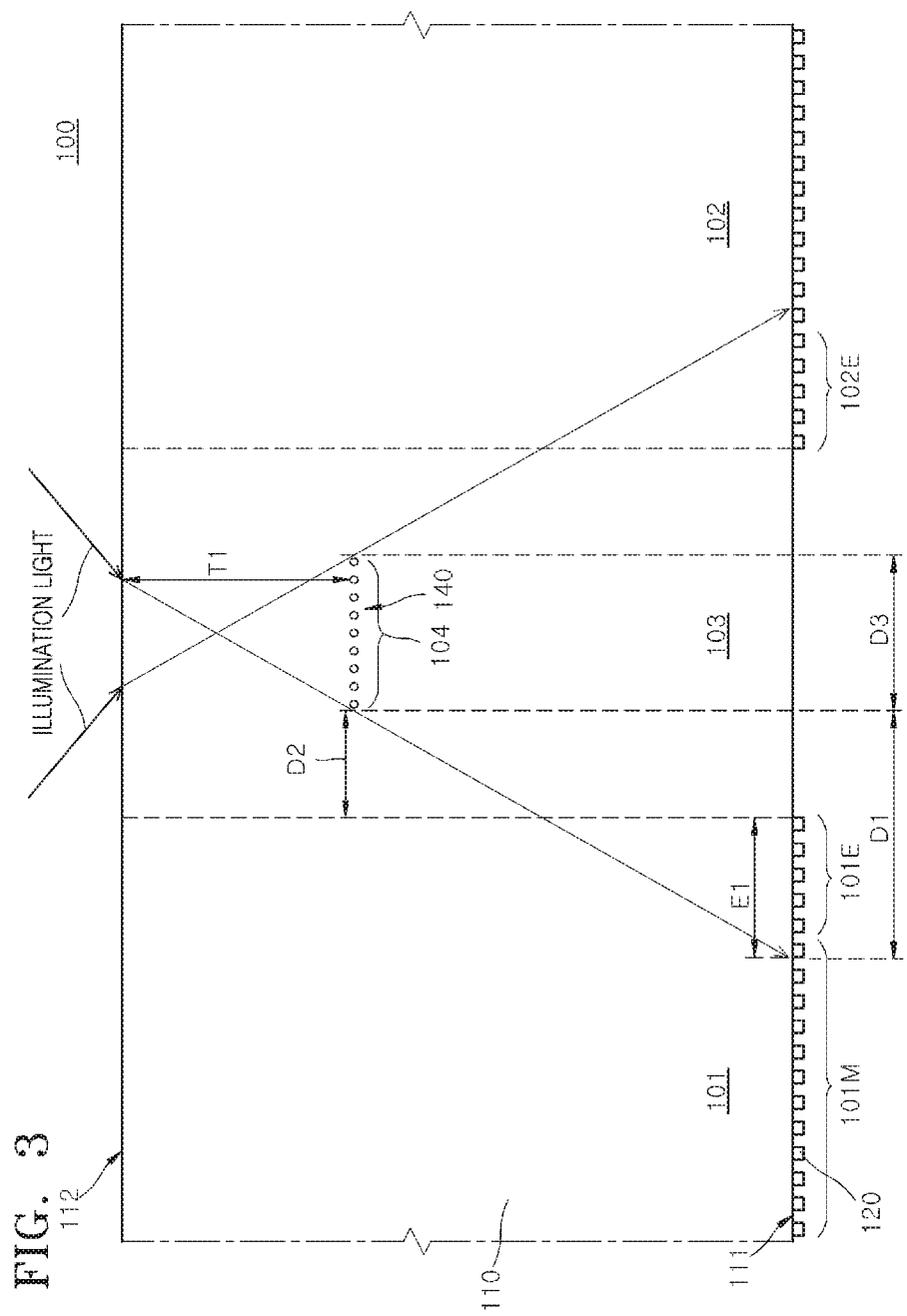
FIG. 3 is a cross-sectional view taken along a line A-A' of FIG. 1.

The shading layer region 104 located in the peripheral region 103 of the photomask 100 may include a shading layer 140 (See FIG. 3). The shading layer 140 may be disposed in the shading layer region 104. The shading layer 140 may weaken a portion of the illumination light irradiated onto the photomask 100 to attenuate the intensity of the illumination light. The shading layer region 104 may be disposed in the peripheral region 103 and may be spaced apart from the first pattern region 101. The shading layer region 104 may also be disposed to be spaced apart from the second pattern region 102 which is adjacent to a side of the shading layer region 104 opposite to the first pattern region 101.

Figure 2:
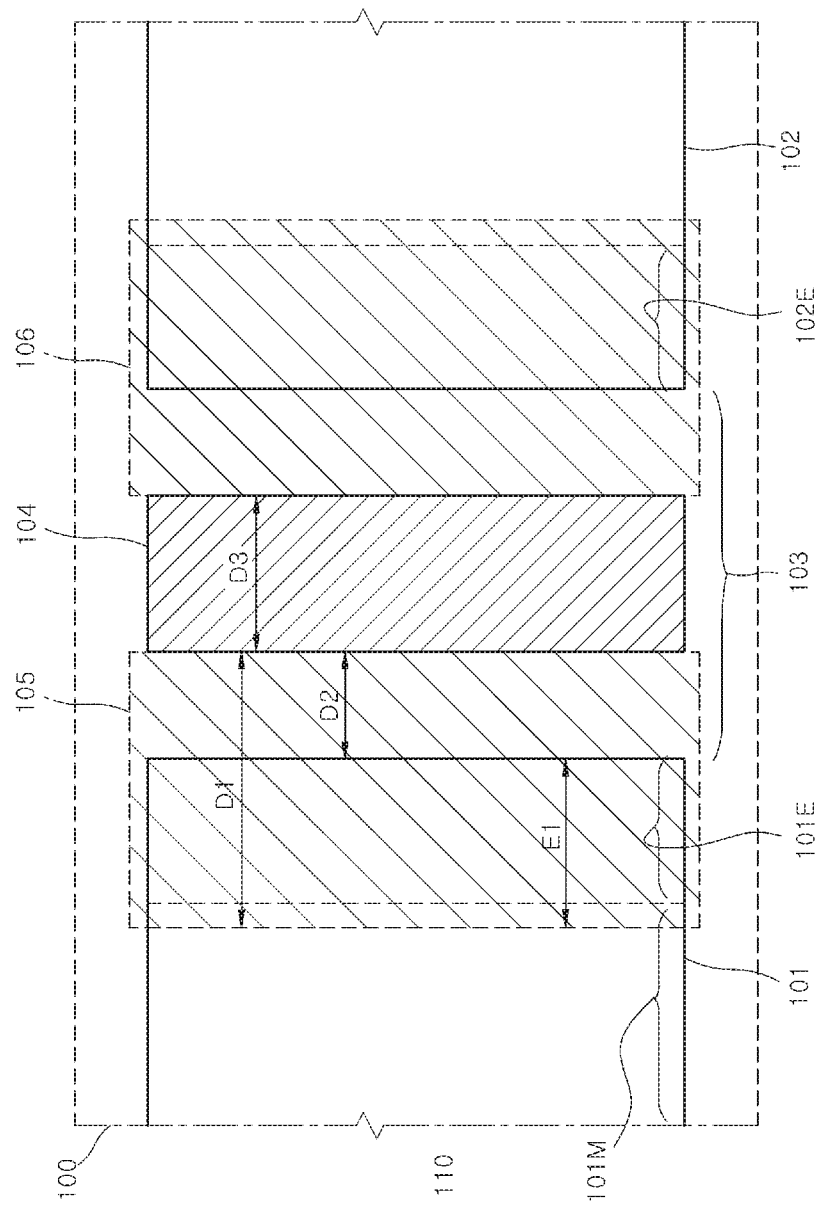
FIG. 2 is a plan view illustrating spill-over-shading regions combined with the photomask of FIG. 1.
Figure 4:
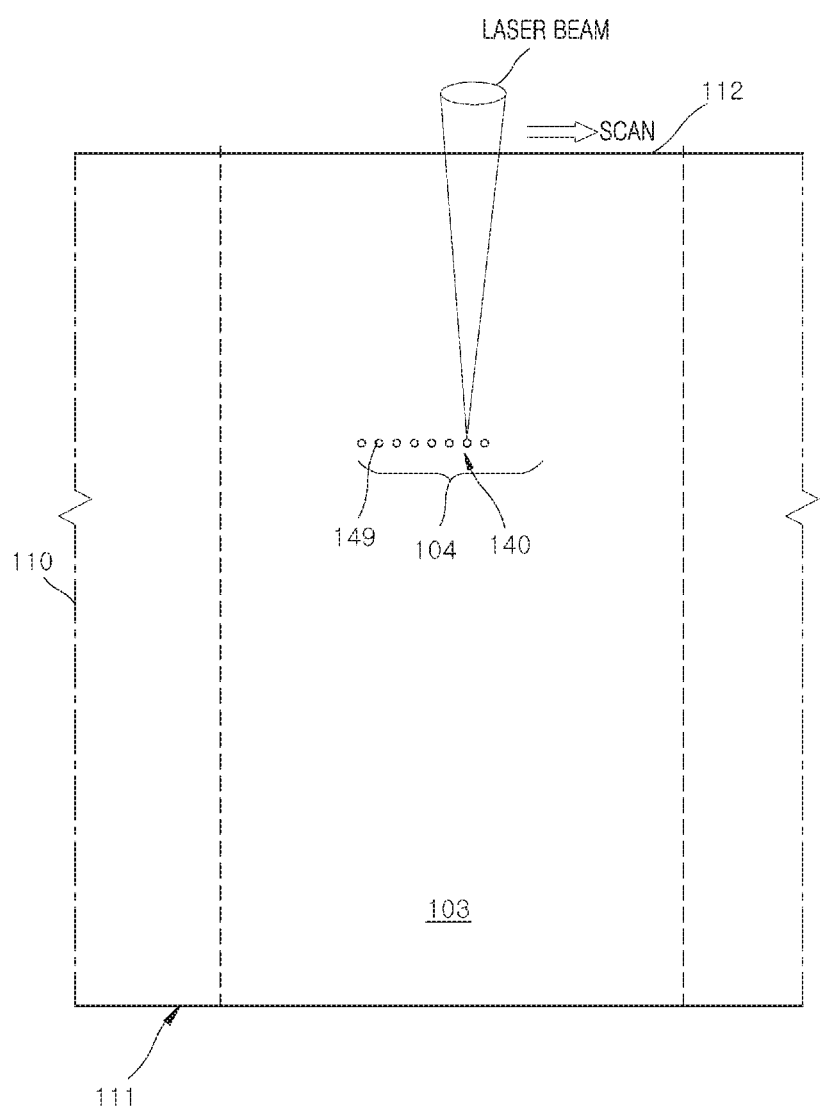
FIG. 4 is a cross-sectional view illustrating a process of forming a shading layer of a photomask in accordance with an embodiment.
Figure 5:
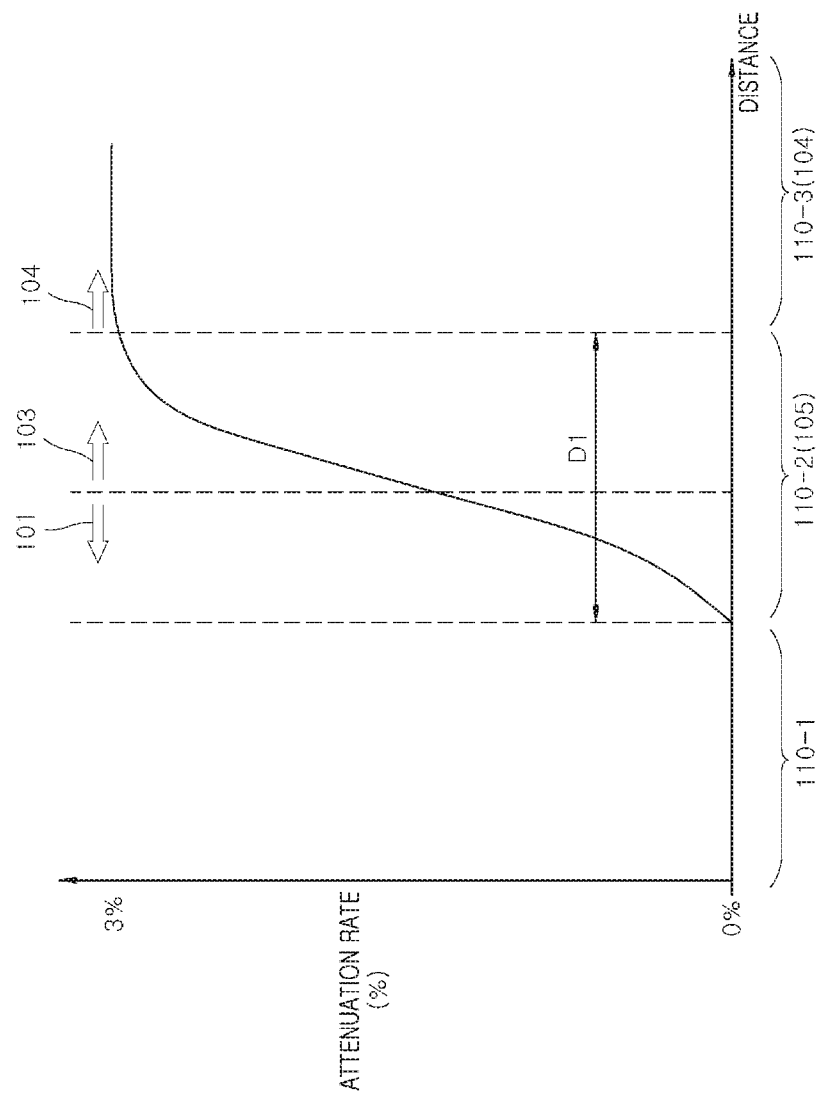
FIG. 5 is a graph illustrating an attenuation rate in spill-over-shading regions of the photomask shown in FIG. 2.
Figure 6:
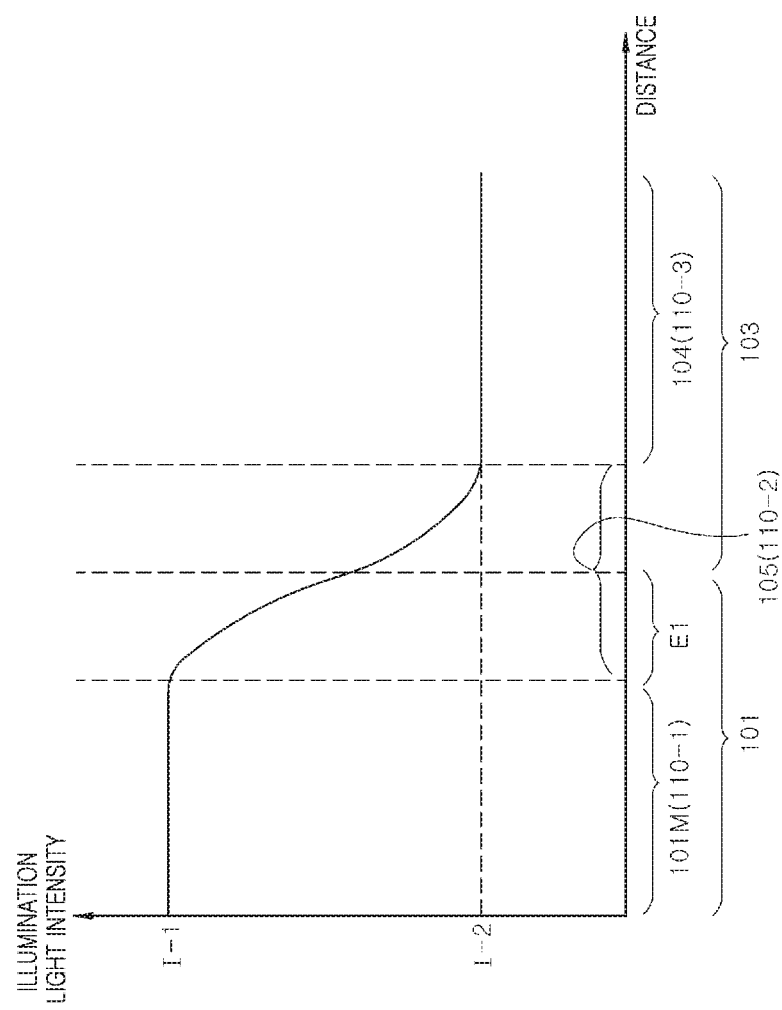
FIG. 6 is a graph illustrating a variation of an illumination light intensity in spill-over-shading regions of the photomask shown in FIG. 2.

FIG. 2 is a plan view illustrating spill-over-shading regions 105 and 106 combined with the photomask 100 of FIG. 1. FIG. 3 is a cross-sectional view taken along line A-A' of FIG. 1. FIG. 4 is a cross-sectional view illustrating a process of forming a shading layer 140 of a photomask in accordance with an embodiment. FIG. 5 is a graph illustrating the attenuation rate in the spill-over-shading regions 105 and 106 of the photomask 100 shown in FIG. 2. FIG. 6 is a graph illustrating a variation of the illumination light intensity in the spill-over-shading regions 105 and 106 of the photomask 100 shown in FIG. 2.

The shading layer 140 illustrated in FIG. 3 may be formed in the shading layer region 104 shown in FIG. 2. The shading layer 140 may attenuate the intensity of the illumination light irradiated into a mask body 110 of the photomask 100.

The photomask 100 may include the mask body 110 having a first surface 111 and a second surface 112 which are opposite to each other. The first surface 111 may correspond to a frontside surface of the mask body 110, and the second surface 112 may correspond to a backside surface of the mask body 110. The mask body 110 may be a transparent substrate. For example, the mask body 110 may be a quartz substrate. Mask patterns 120 may be disposed on the first surface 111 of the mask body 110 to provide pattern images which are transferred onto a resist layer coated on a wafer. The mask patterns 120 may be disposed in the first and second pattern regions 101 and 102 of the first surface 111 of the mask body 110. The mask patterns 120 may not be disposed in the peripheral region 103 of the first surface 111 of the mask body 110.

The shading layer 140 may be formed using a laser beam, as illustrated in FIG. 4. For example, a laser beam may be irradiated onto the second surface 112 of the mask body 110 to be focused on a portion of the shading layer region 104 in the mask body 110 to form a deformation element 149 in the shading layer region 104. The deformation element 149 may have a three-dimensional volume and may have a crystalline structure which is different from the material (e.g., a quartz material) of the mask body 110. If the laser beam is scanned repeatedly, and intermittedly in a direction, a plurality of deformation elements 149 may be formed in the shading layer region 104 to provide the shading layer 140. The deformation elements 149 may decrease an optical transmittance of the shading layer region 104 in the mask body 110 which is comprised of a substantially transparent material, for example, a quartz material. In an embodiment, the deformation elements 149 may be scratches formed in the shading layer region 104 of the mask body 110. Accordingly, the shading layer 140 may attenuate an intensity of the illumination light passing through a region that overlaps with the shading layer 140.

Referring to FIGS. 2 and 3, due to the presence of the shading layer 140 formed in the mask body 110, the spill-over-shading regions 105 and 106 may be provided at both sides of a region D3 (i.e., the shading layer region 104) which directly overlaps with the shading layer 140 as illustrated in a plan view of FIG. 2. The spill-over-shading regions 105 and 106 may correspond to shadow regions of the shading layer 140 when the illumination light is irradiated onto the mask body 110. The region D3 directly overlapping with the shading layer 140 may be limited in the peripheral region 103 corresponding to a portion of the first surface 111 through which the illumination light is outputted from the mask body 110. Each of the spill-over-shading regions 105 and 106 may have a region D1 extending from the shading layer region 104 by a certain distance at the first surface 111 of the mask body 110.

As illustrated in FIG. 3, the spill-over-shading regions 105 and 106 are formed by a spill-over phenomenon of the illumination light which is irradiated onto the shading layer region 104. When the illumination light is irradiated onto the shading layer region 104, shadows of the shading layer 140 may extend out of the shading layer 140 to provide the spill-over-shading regions 105 and 106. As illustrated in FIG. 5, a region 110-3 substantially and fully overlapping with the shading layer region 104 may be a region to which 100 percent of an attenuation effect of the shading layer 140 is fully applied. For example, if the shading layer 140 is formed to have an attenuation rate of 3 percent, the illumination light penetrating the region 110-3 may have an intensity which is reduced by 3 percent. That is, the region 110-3 substantially and fully overlapping with the shading layer region 104 may be a region to which an attenuation effect of the shading layer 140 is fully applied.

In a region 110-2 extending from the shading layer 140 toward the first or second pattern region 101 or 102 by a certain distance, an intensity of the illumination light penetrating the region 110-2 may be gradually reduced away from the region 110-3. That is, an intensity of the illumination light penetrating the region 110-2 corresponding to the spill-over-shading region 105 may be gradually reduced away from the region 110-3 to provide the spill-over-shading region 105 partially exhibiting a shading effect of the shading layer 140. The region 110-2 may be located between the region 110-3 to which an attenuation effect of the shading layer 140 is fully applied and a region 110-1 to which an attenuation effect of the shading layer 140 is not applied. The spill-over-shading regions 105 and 106 may provide an attenuation rate which is lower than an attenuation rate of the illumination light that the shading layer 140 directly provides. For example, the spill-over-shading regions 105 and 106 may provide an average attenuation rate of approximately 1 percent to approximately 2 percent. The regions which are partially influenced by the shading effect of the shading layer 140 are defined as the spill-over-shading regions 105 and 106.

Referring to FIGS. 3, 5 and 6, in the region 110-3 substantially and fully overlapping with the shading layer region 104, an intensity I-1 of the illumination light irradiated onto the second surface 112 of the mask body 110 of the photomask 100 may be reduced to an intensity I-2 by the shading layer 140, and the illumination light having the intensity I-2 may be outputted from the mask body 110 through the first surface 111 of the mask body 110. Since the region 110-3 substantially and fully overlapping with the shading layer region 104 is a region to which 100 percent of an attenuation effect of the shading layer 140 is fully applied, an attenuation rate (e.g., 3 percent) provided by the shading layer 140 may be applied to the shading layer region 104.

As illustrated in FIGS. 2 and 3, a portion of each of the spill-over-shading regions 105 and 106 may be located to overlap with the first edge region 101E or the second edge region 102E in which CD correction is required. In such a case, a position of the shading layer 140 may be adjusted. That is, a position of the shading layer 140 may be changed or controlled so that the first spill-over-shading region 105 overlaps with an entire portion of the first edge region 101E in which CD correction is required. In addition, a position of the shading layer 140 may be changed or controlled so that the second spill-over-shading region 106 overlaps with an entire portion of the second edge region 102E in which the CD correction is required. An overlap region E1 of the first spill-over-shading region 105 and the first pattern region 101 may extend to include at least the first edge region 101E in which the CD correction is required.

Referring again to FIGS. 3 and 6, in the region 110-2 corresponding to the first spill-over-shading region 105, the intensity I-1 of the illumination light irradiated onto the second surface 112 of the mask body 110 of the photomask 100 may be reduced by the shading effect of the shading layer 140, and the illumination light having the reduced intensity may be outputted from the mask body 110 through the first surface 111 of the mask body 110. In such a case, in the first spill-over-shading region 105, the intensity of the illumination light may gradually increase from the shading layer region 104 toward the inside region 101M. That is, in the first spill-over-shading region 105, the intensity of the illumination light may gradually increase from the intensity I-2 having a minimum value to the intensity I-1 corresponding to an initial intensity of the illumination light irradiated onto the second surface 112 of the mask body 110 toward the inside region 101M.

In the overlap region E1 of the first spill-over-shading region 105 and the first pattern region 101 or in the first edge region 101E in which the CD correction is required, the illumination light outputted from the mask body 110 through the first surface 111 may have an intensity which is less than the intensity I-1 of the illumination light irradiated onto the second surface 112 and which is greater than the reduced intensity I-2. That is, an intensity of the illumination light outputted from the first spill-over-shading region 105 through the first surface 111 may be greater than an intensity of the illumination light outputted through a portion of the first surface 111 directly overlapping with the shading layer 140 and may be less than an intensity of the illumination light outputted through the first surface 111 of the inside region 101M not overlapping with the first spill-over-shading region 105. In the overlap region E1 of the first spill-over-shading region 105 and the first pattern region 101 or in the first edge region 101E in which the CD correction is required, an intensity of the illumination light outputted through the first surface 111 may gradually increase from a side of the first edge region 101E adjacent to the peripheral region 103 toward the inside region 101M.

In the overlap region E1 of the first spill-over-shading region 105 and the first pattern region 101 or in the first edge region 101E in which the CD correction is required, the illumination light outputted through the first surface 111 may be controlled to have an intensity which is less than the intensity I-1 of the illumination light irradiated onto the second surface 112. Thus, it may be possible to correct or change the first space (S1 of FIG. 10) between the first resist patterns (210E of FIG. 10) formed by transferring the images of the mask patterns 120 disposed in the first edge region 101E to a resist layer. For example, it may be possible to reduce the first space (S1 of FIG. 10) between the first resist patterns (210E of FIG. 10).

Referring again to FIG. 3, a width of the region D1 extending from the shading layer region 104 may vary according to a depth T1 corresponding to a distance between the shading layer 140 the second surface 112 of the mask body 110. In addition, a width of the region D1 extending from the shading layer region 104 may vary according to a distance D2 between the shading layer 140 and the first pattern region 101. Moreover, a width of the region D1 extending from the shading layer region 104 may vary according to a width of the region D3 directly overlapping with the shading layer 140, that is, according to a width of the shading layer 140.

Accordingly, a width of the region D1 extending from the shading layer region 104 to overlap with the first edge region 101E may be controlled by changing the depth T1 of the shading layer 140, the width of the region D3, and the distance D2. That is, boundaries of the first and second spill-over-shading regions 105 and 106 may be defined by setting a position of the shading layer 140. Thus, it may be possible to define each of the first and second spill-over-shading regions 105 and 106 as a specific region narrower than the first edge region 101E by changing a position or a width of the shading layer 140.

Figure 7:
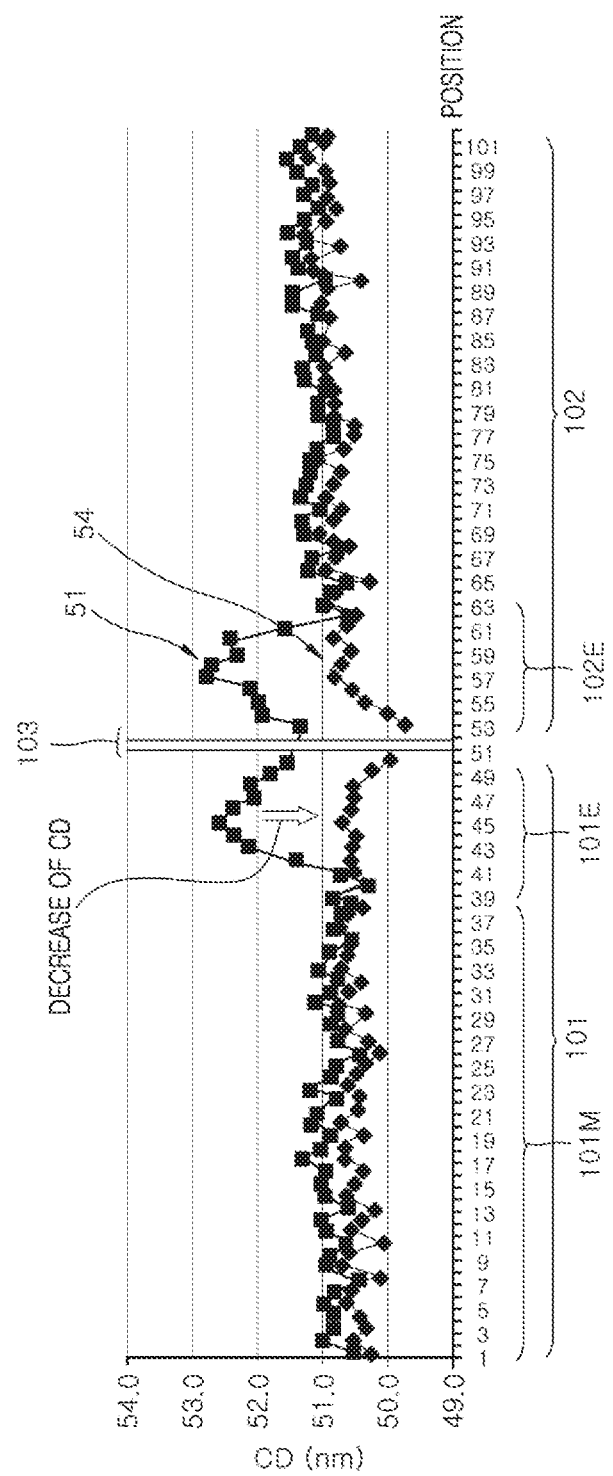
FIG. 7 is a graph illustrating a critical dimension (CD) correction effect due to presence of a shading layer of a photomask in accordance with an embodiment.

FIG. 7 is a graph illustrating a critical dimension (CD) correction effect obtained by a shading layer of a photomask in accordance with an embodiment.

Referring to FIG. 7, if resist patterns are formed on a wafer using the photomask (100 of FIG. 1) that includes the shading layer (140 of FIG. 3) which is disposed in the peripheral region (103 of FIG. 1), a space 54 between the resist patterns formed on regions of the wafer corresponding to the first and second edge regions 101E and 102E may be corrected to be substantially equal to or close to spaces between the resist patterns formed on a region of the wafer corresponding to the inside region 101M of the photomask 100. In contrast, if the resist patterns 210 are formed on the wafer 200 using a photomask (not shown) without the shading layer (140 of FIG. 3) as described with reference to FIG. 10, a space 51 (i.e., the first space S1 of FIG. 10) between the resist patterns 210 formed on regions of the wafer 200 corresponding to the first and second edge regions 101E and 102E may be greater than the space 54. As described with reference to FIG. 3, the shading layer 140 may be disposed to be spaced apart from the first and second edge regions 101E and 102E without overlapping with the first and second edge regions 101E and 102E in a plan view. Thus, the shading layer 140 may act as a CD correction layer that reduces a space between the resist patterns formed on regions of the wafer corresponding to the edge regions 101E and 102E in which the CD correction is required. If a position of the shading layer 140 is appropriately controlled, only CDs of resist patterns corresponding to the mask patterns disposed in the first and second edge regions 101E and 102E may be selectively corrected.

If it is assumed that the shading layer 140 is disposed to overlap with the first and second edge regions 101E and 102E, the attenuation effect of the illumination light intensity due to spill-over-shading regions provided by the shading layer may influence the inside region 101M. Thus, a space between resist patterns formed by transferring images of the mask patterns 120 in the inside region 101M onto a wafer may be reduced to cause a process failure. In accordance with the embodiments, the shading layer 140 may be disposed in the peripheral region 103 to be spaced apart from the first and second edge regions 101E and 102E without overlapping with the first and second edge regions 101E and 102E in a plan view. Thus, CDs of resist patterns formed by transferring images of the mask patterns 120 in the first and second edge regions 101E and 102E may be corrected.

Figure 8:
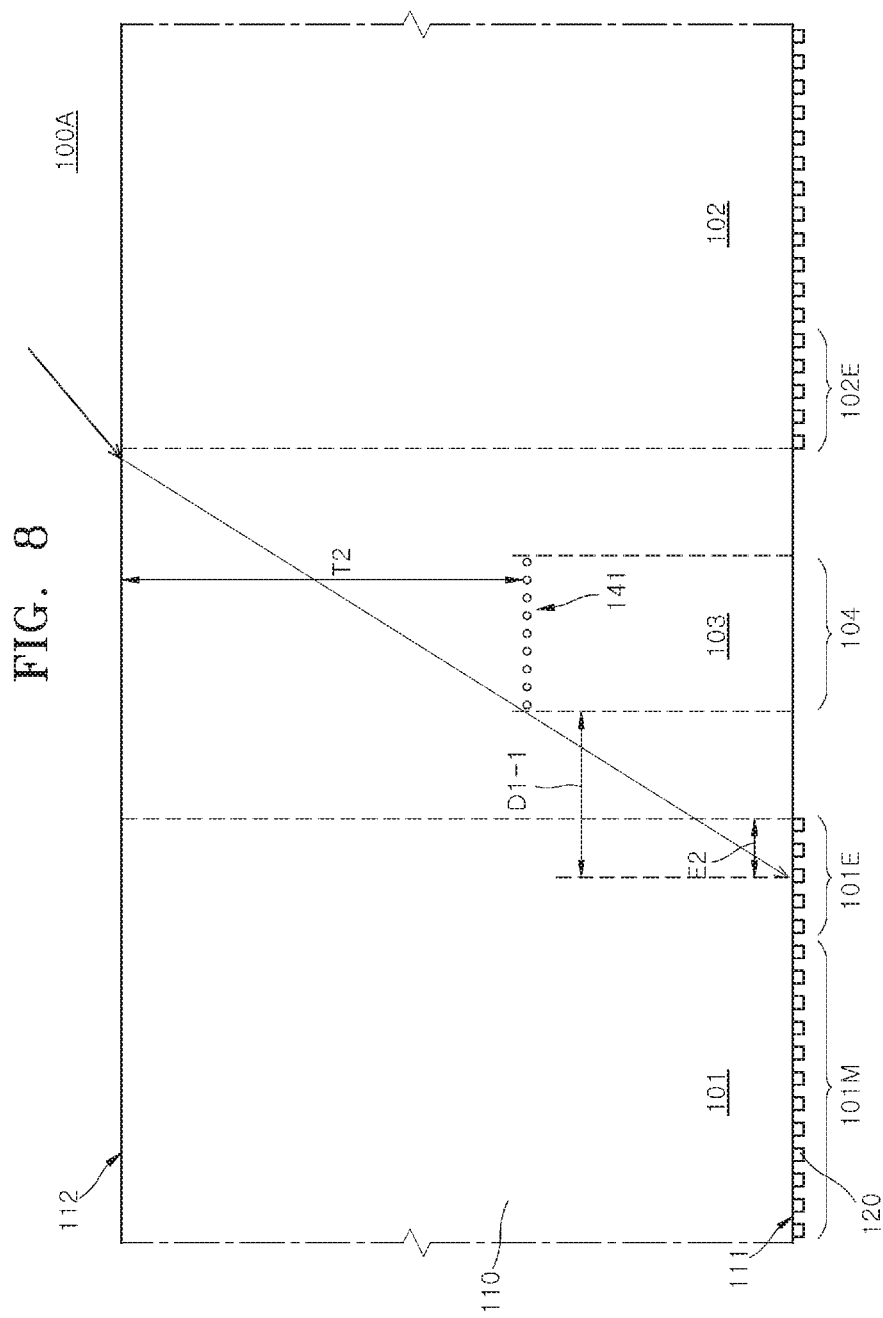
FIGS. 8 and 9 are cross-sectional views illustrating spill-over-shading regions differently formed according to positions of shading layers of photomasks in accordance with an embodiment.
Figure 9:
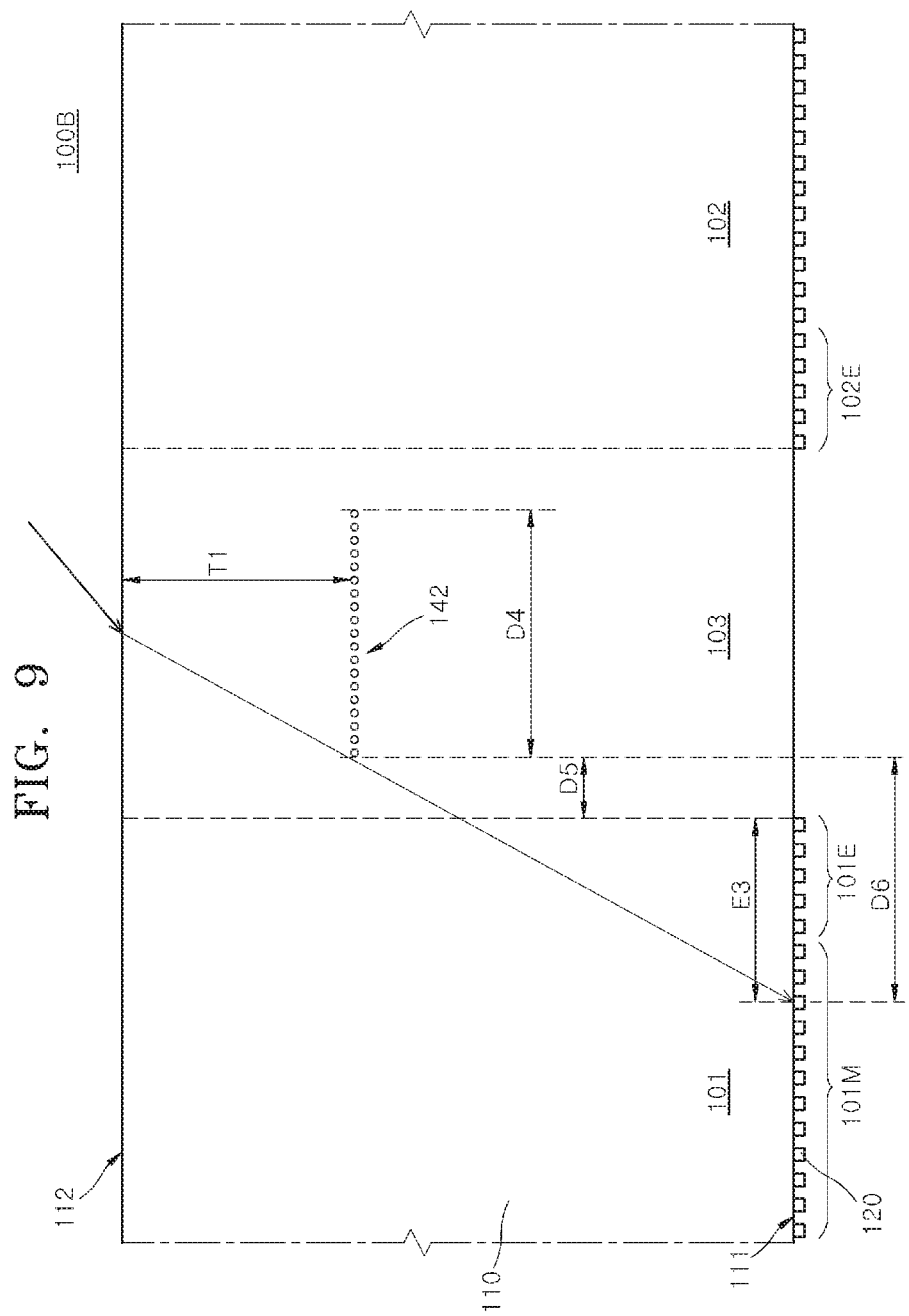

FIGS. 8 and 9 are cross-sectional views illustrating spill-over-shading regions differently formed according to positions of shading layers 141 and 142 of photomasks 100A and 100B in accordance with some embodiments.

Referring to FIG. 8, if the shading layer 141 included in the peripheral region 103 of the photomask 100A is located at a depth T2 which is greater than the depth (T1 of FIG. 3), a width of an overlap region E2 between a spill-over-shading region provided by the shading layer 141 and the first edge region 101E may be reduced. If the depth T2 of the shading layer 141 is set to be greater than the depth T1 of the shading layer 140 illustrated in FIG. 3, a width of the overlap region E2 between an extended region D1-1 provided by the shading layer 141 and the first edge region 101E may be reduced. Thus, a width of a region in which the CD of mask patterns is corrected may also be reduced.

Referring to FIG. 9, if a distance D5 between the shading layer 142 and the first pattern region 101 is reduced to be less than the distance D2 illustrated in FIG. 3, a region D6 corresponding to a spill-over-shading region provided by the shading layer 142 may further extend into the inside region 101M. Thus, a width of an overlap region E3 between the region D6 and the first pattern region 101 including the first edge region 101E may increase. Moreover, if a width D4 of the shading layer 142 increases, the distance D5 between the shading layer 142 and the first pattern region 101 may be additionally reduced.

Referring to FIGS. 8 and 9, the widths of the overlap regions E2 and E3 between the first pattern region 101 and the extended regions D1-1 and D6 may be controlled to be different by changing a position, a depth and/or a width of the shading layer 141 or 142 disposed in the mask body 110 of the photomask 100A or 100B. Thus, a width of a CD correction region overlapping with the extended regions D1-1 and D6 may be easily controlled by appropriately changing a position, a depth and/or a width of the shading layer 141 or 142 disposed in the mask body 110 of the photomask 100A or 100B. Accordingly, an intensity of the illumination light irradiated into the CD correction region may be selectively reduced to locally correct the CDs of the patterns formed on a wafer. That is, as illustrated in FIG. 3, a size, a depth or a position of the shading layer region 104 in which the shading layer 104 is disposed may be set to be different according to a size and a position of a region in which CD correction is required.

Referring again to FIG. 3, resist patterns may be formed on a wafer using the photomask 100 in accordance with an embodiment. In such a case, a width of the overlap region E1 between the spill-over-shading region (105 of FIG. 2) and the first pattern region 101 may be controlled by changing a position of the shading layer 140. When images of the mask patterns 120 included in the photomask 100 are transferred onto a resist layer coated on a wafer to form resist patterns, CDs of the resist patterns formed in a region corresponding to the overlap region E1 may be corrected.

Although the embodiments of the present disclosure have been described with reference to the accompanying drawings, the embodiments described above are for illustrative purposes only and are not intended to limit the scope of the present disclosure. Accordingly, those skilled in the art will appreciate that various modifications, additions and substitutions are possible, without departing from the scope and spirit of the present disclosure and the accompanying claims.

What is claimed is:

1. A photomask comprising:
a mask body including a first surface and a second surface, the first surface including a first pattern region and a peripheral region;
mask patterns disposed on the first pattern region; and
a shading layer disposed in the peripheral region,
wherein the shading layer provides a spill-over-shading region extending to overlap with a critical dimension (CD) correction region of the first pattern region.

2. The photomask of claim 1, wherein the shading layer is disposed in the peripheral region between the first surface and the second surface of the mask body.

3. The photomask of claim 1, wherein the shading layer is disposed to be spaced apart from the first pattern region by a certain distance.

4. The photomask of claim 1, wherein the shading layer is disposed so that the spill-over-shading region extends outside of the shading layer to overlap with a portion of the first pattern region.

5. The photomask of claim 1, wherein a width of an overlap region of the spill-over-shading region and the first pattern region is set according to a depth corresponding to a distance between the shading layer and the second surface of the mask body.

6. The photomask of claim 1, wherein a width of an overlap region of the spill-over-shading region and the first pattern region is set according to a distance between the shading layer and the first pattern region.

7. The photomask of claim 1, wherein a width of an overlap region of the spill-over-shading region and the first pattern region is set according to a width of the shading layer.

8. The photomask of claim 1, wherein an intensity of illumination light penetrating the spill-over-shading region to output through the first surface of the mask body is greater than an intensity of the illumination light outputted through the first surface directly overlapping with the shading region and is less than an intensity of the illumination light outputted through the first surface not overlapping with the spill-over-shading region.

9. The photomask of claim 1, wherein the spill-over-shading region provides an attenuation rate which is lower than an attenuation rate of illumination light that the shading layer directly provides.

10. The photomask of claim 1, wherein the shading layer includes deformation elements having a crystalline structure which is different from the mask body.

11. The photomask of claim 1, wherein the peripheral region does not include mask patterns.

12. The photomask of claim 1, further comprising a second pattern region,
wherein the first and second pattern regions correspond to a cell array region of a semiconductor device; and
wherein the peripheral region is disposed between the first and second pattern regions.

13. The photomask of claim 1, wherein the CD correction region includes:
a first edge region of the first pattern region which is adjacent to the peripheral region, and
a second edge region of the second pattern region which is adjacent to the peripheral region.

14. A method of forming patterns using a photomask including a mask body including a pattern region and a peripheral region and having a first surface and a second surface, mask patterns disposed on a portion overlapping with the pattern region of the first surface of the mask body, and a shading layer disposed in the peripheral region, wherein the shading layer provides a spill-over-shading region extending to overlap with a critical dimension (CD) correction region in which CD correction in the pattern region is required, the method comprising:
changing a position of the shading layer to control a width of an overlap region of the spill-over-shading region and the pattern region; and
transferring pattern images onto a resist layer using the photomask.

15. The method of claim 14, wherein changing the position of the shading layer includes changing a distance between the shading layer and the pattern region.

16. The method of claim 14, wherein changing the position of the shading layer includes changing a depth corresponding to a distance between the shading layer and the second surface of the mask body.

17. The method of claim 14, wherein changing the position of the shading layer includes changing a width of the shading layer.

18. The method of claim 14, wherein the spill-over-shading region attenuates an intensity of illumination light outputted from the spill-over-shading region through the first surface of the mask body to reduce a space between patterns formed in the resist layer.

19. A method of forming fine patterns, the method comprising:
providing a photomask, wherein the photomask comprises a mask body including a first surface and a second surface, the first surface including a first pattern region and a peripheral region; mask patterns disposed on the first pattern region; and a shading layer disposed in the peripheral region, and wherein the shading layer provides a spill-over-shading region extending to overlap with a critical dimension (CD) correction region of the first pattern region,
changing a position of the shading layer to control a width of an overlap region of the spill-over-shading region and the first pattern region; and
transferring pattern images onto a resist layer using the photomask.

20. The method of claim 19, wherein the changing of the position of the shading layer includes changing a distance between the shading layer and the first pattern region.

* * * * *